US012578376B2

(12) United States Patent
Bernhard

(10) Patent No.: US 12,578,376 B2
(45) Date of Patent: Mar. 17, 2026

(54) OPTICAL SENSOR AND METHOD OF DETECTING AN LED IN SUCH A SENSOR

(71) Applicant: Endress+Hauser Conducta GmbH+Co. KG, Gerlingen (DE)

(72) Inventor: Ralf Bernhard, Stuttgart (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 374 days.

(21) Appl. No.: 17/816,916

(22) Filed: Aug. 2, 2022

(65) Prior Publication Data

US 2023/0033488 A1     Feb. 2, 2023

(30) Foreign Application Priority Data

Aug. 2, 2021    (DE) .......................... 102021120018.0

(51) Int. Cl.
*G01R 31/26* (2020.01)
*G01J 1/44* (2006.01)

(52) U.S. Cl.
CPC ............ *G01R 31/2635* (2013.01); *G01J 1/44* (2013.01); *G01J 2001/446* (2013.01)

(58) Field of Classification Search
CPC ...... G01J 1/44; G01J 2001/446; G01J 1/0238; G01J 3/0264; G01J 3/0275; G01J 3/0291; G01J 3/10; G01R 31/2635; G01R 31/27; A23L 33/105; A23V 2002/00; A23V 2200/312; A61K 2236/00; A61K 31/7048; A61K 36/185; A61K 36/77; A61K 8/602;
(Continued)

(56) References Cited

U.S. PATENT DOCUMENTS

| | | | |
|---|---|---|---|
| 2012/0038289 A1* | 2/2012 | Jee .......................... | H05B 45/10 |
| | | | 362/382 |
| 2015/0053575 A1* | 2/2015 | Bridges .................. | G01D 3/032 |
| | | | 205/787.5 |

(Continued)

FOREIGN PATENT DOCUMENTS

| | | | |
|---|---|---|---|
| CN | 104113963 A | * | 10/2014 |
| DE | 102012112901 A1 | | 10/2015 |

(Continued)

OTHER PUBLICATIONS

Dietzsch, Stefan, Entwicklung einer Ansteuerelektronik für Hochleistungs—LEDs (Development of drive electronic for high-power LEDs), Thesis for Diploma for Electrical Engineering, Sep. 14, 2011, Zwichkau, Germany. (Machine translation provided).

*Primary Examiner* — Tri T Ton
(74) *Attorney, Agent, or Firm* — Christopher R. Powers; Endress+Hauser (USA) Holding, Inc.

(57) ABSTRACT

The present disclosure relates to an optical sensor, comprising: a first circuit board having at least a data processing unit and an interface to a second circuit board, wherein the interface is connected with the data processing unit; and the second circuit board having an LED, a thermistor and a capacitor, which is connected in parallel with the thermistor, wherein the capacitor is embodied specifically for the LED, and an interface to the first circuit board, wherein LED, thermistor and capacitor are connected with the interface. The present disclosure relates also to a method for identifying an LED in an optical sensor.

4 Claims, 3 Drawing Sheets

(58) Field of Classification Search
CPC .... A61K 8/9789; A61K 9/006; A61K 9/0063;
A61P 1/02; A61Q 11/00
USPC ........................................................ 356/218
See application file for complete search history.

(56) References Cited

U.S. PATENT DOCUMENTS

2017/0261427 A1* 9/2017 Deliwala ............... G01J 3/0262
2019/0373689 A1* 12/2019 Fang ...................... H05B 45/50

FOREIGN PATENT DOCUMENTS

KR        101122166 B1    3/2012
WO        2016034540 A1    3/2016

* cited by examiner

10

100

12

7

8

11

6

OPTICAL SENSOR AND METHOD OF DETECTING AN LED IN SUCH A SENSOR

CROSS-REFERENCE TO RELATED APPLICATION

The present application is related to and claims the priority benefit of German Patent Application No. 10 2021 120 018.0, filed on Aug. 2, 2021, the entire contents of which are incorporated herein by reference.

TECHNICAL FIELD

The present disclosure relates to an optical sensor and to a method for identifying a light-emitting diode (LED) in an optical sensor.

BACKGROUND

Frequently, the sensor electronics of such a sensor is composed of two parts, namely an "intelligent" main board, which is responsible for measuring, calculating, energy supply and communication, and an "unintelligent" additional board, which has only analog components (LED, photodiode, etc.). The main board is referred to as the "first board" or "first circuit board" or "first circuit card," while the additional board is referred to as the "second board" or "second circuit board" or "second circuit card."

Due to the continuing development of LEDs, it can be assumed that the installed LED-type will change in the course of time, while the remaining components of the sensor remain unchanged. Since these changes can affect the operation of the LED and the calculating of the measured values, it is desirable that the installed LED-type can be automatically identified. Otherwise, it would be necessary, in the case of combining any boards (during production or in the context of a replacement), to tell the main board ("first circuit board") which LED-type is installed on the additional board ("second circuit board"). Since the possibility of an automatic identification is not provided, an identification must be achieved by investigating the additional board. It would, indeed, be possible to provide an additional digital memory on the additional board. That would require, however, additional electrical connections between the boards, a feature that is not desired for a number of reasons. For instance, the measurement signals coming from the additional board are very small and disturbance susceptible, because of which additional lines connecting the boards should be avoided. Additionally, additional lines also necessitate altering the main board.

SUMMARY

An object of the present disclosure is to provide an automatic identification of an LED of optical sensors in a simple manner.

The object is achieved by an optical sensor, comprising: a first circuit board having at least a data processing unit and an interface to a second circuit board, wherein the interface is connected with the data processing unit; and the second circuit board having an LED, a thermistor and a capacitor, which is connected in parallel with the thermistor, wherein the capacitor is embodied specifically for the LED, and an interface to the first circuit board, wherein the LED, thermistor and capacitor are connected with the interface.

Advantages of the present disclosure include that only minimum hardware changes are necessary, namely only a capacitor on the second circuit board. No changes are needed on the first circuit board. No additional lines between the boards are necessary.

Operation deviating from the normal temperature measurement for LED identification occurs, for example, only for a short time upon the booting of the sensor. Thereafter, exactly the same electrical conditions prevail as in the case of a non-modified arrangement. A change of the metrological behavior by the modification is thus avoided.

During manufacture, no information needs to be written into a memory. The information is hardwired by populating the right combination of LED and capacitor. As a result, also no expansion or alteration of the manufacturing plant is necessary.

In at least one embodiment, the second circuit board includes a photodiode.

In at least one embodiment, the sensor includes a resistor arranged to form a voltage divider with the thermistor.

In at least one embodiment, the first circuit board includes a resistor arranged to form a voltage divider with the thermistor of the second circuit board.

The object is further achieved by a method for identifying an LED in an optical sensor as above described, which method comprises steps as follows: applying a DC voltage across the voltage divider and charging the capacitor, turning off the DC voltage, determining the discharge curve of the capacitor, determining the value of the capacitor, and determining the type of LED based on the value of the capacitor specific for the particular LED.

In at least one embodiment, the data processing unit on the first circuit board controls the application and turning off of the DC voltage and performs the determinations.

BRIEF DESCRIPTION OF THE DRAWINGS

Such will now be explained in greater detail based on the appended drawing, the figures of which show as follows.

In the figures, the same features are provided with the same reference characters.

DETAILED DESCRIPTION

Figure 1:
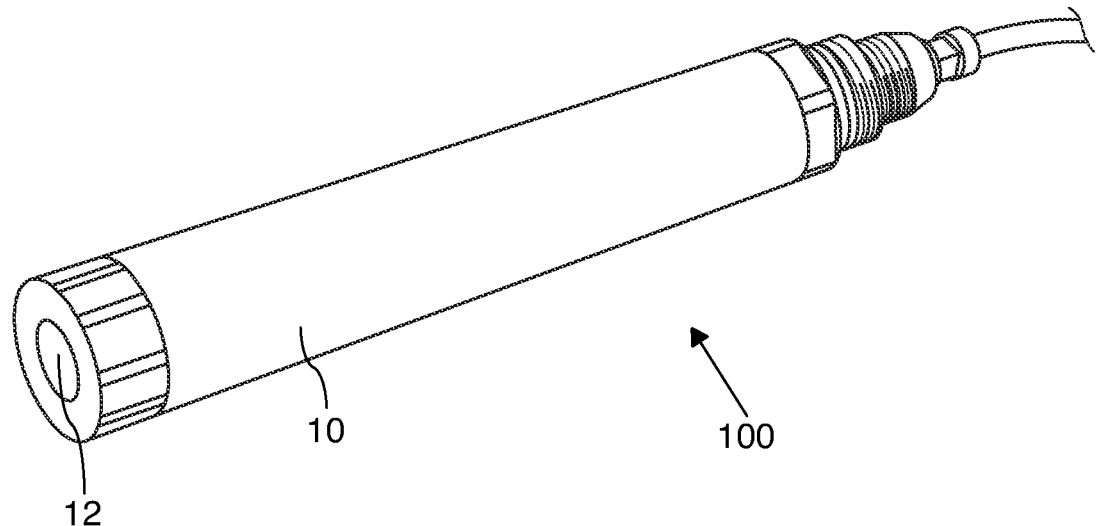
FIG. 1 shows a sensor according to an embodiment of the present disclosure.
Figure 2:
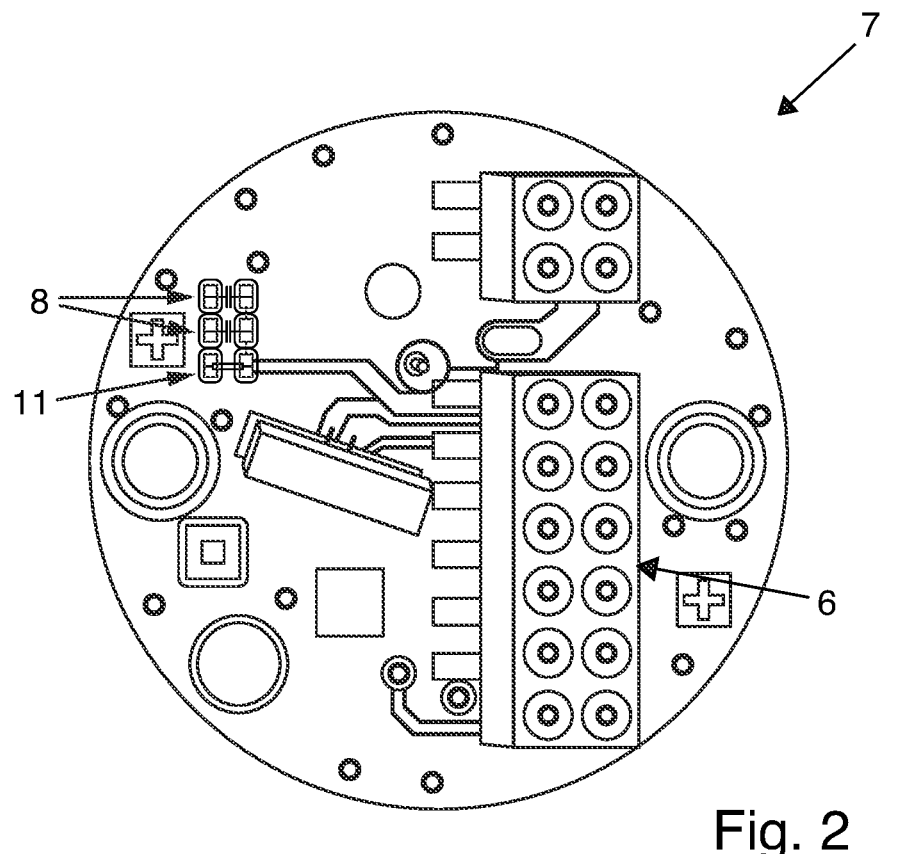
FIG. 2 shows a second circuit board in plan view according to an embodiment of the present disclosure.
Figure 3:
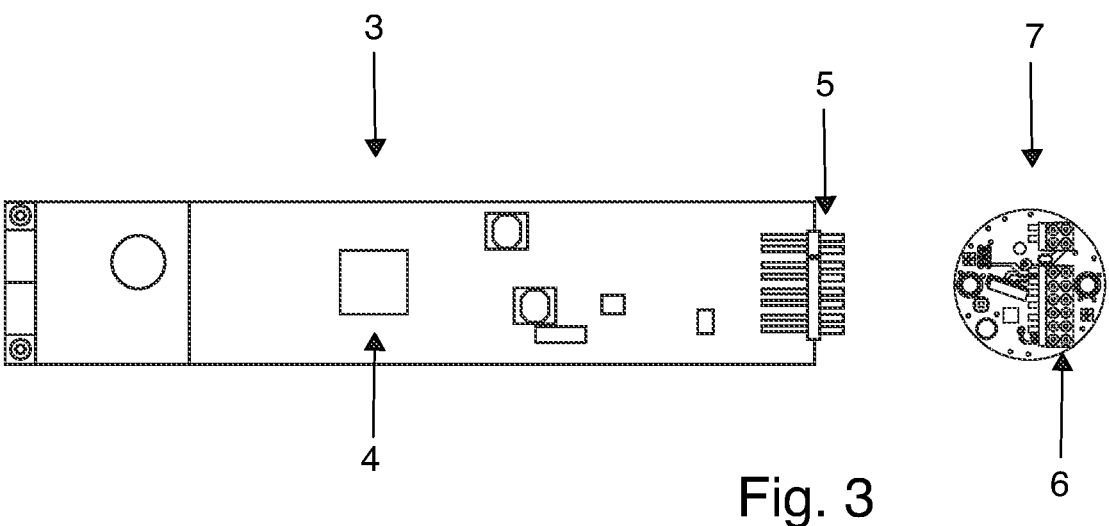
FIG. 3 shows the first and second circuit boards next to one another according to an embodiment of the present disclosure.

A sensor according to an embodiment of the present disclosure in its totality bears the reference character 100 and is shown in FIG. 1. Sensor 100 includes a housing 10 and an optical window 12. Within the housing 10 are located a first circuit board 3 having a data processing unit 4 and a second circuit board 7 having an LED 1 and a capacitor 8 as shown in FIGS. 2 and 3.

The sensor 100 may be suitable for determining the oil-in-water content of a medium or for determining the polycyclic aromatic hydrocarbon (PAH) content in the case of exhaust gas washing, for example, on ships. Likewise, the optical sensor can be used for determining turbidity. Also, one or more analytical parameters can be determined optically, for instance, oxygen, pH value, sludge level, nitrate or spectral absorption coefficient (SAC) measurement. Likewise, an embodiment is possible as NIR/VIS absorption sensor or UV absorption sensor.

All optical sensors have one or more light sources, in the present case at least one LED 1. Light from the LED 1 is transmitted in the direction of the medium to be measured and correspondingly converted there. Finally, the light is received by a receiver, here a photodiode 2.

As mentioned above, the sensor 100 includes two circuit boards, namely as defined above, the first circuit board 3 and the second circuit board 7. These are shown next to one another in FIG. 3. FIG. 2 shows an enlarged view of the second circuit board 7.

The first circuit board 3 is an "intelligent" main board, which is responsible for measuring, calculating, energy supply and communication. This includes a data processing unit 4, for example, a microcontroller. The second circuit board 7 is an "unintelligent" additional board, which has only analog components, thus, the LED 1, photodiode 2 and a thermistor 11. The LED 1 and the photodiode 2 are shown only schematically in FIG. 4.

Figure 4:
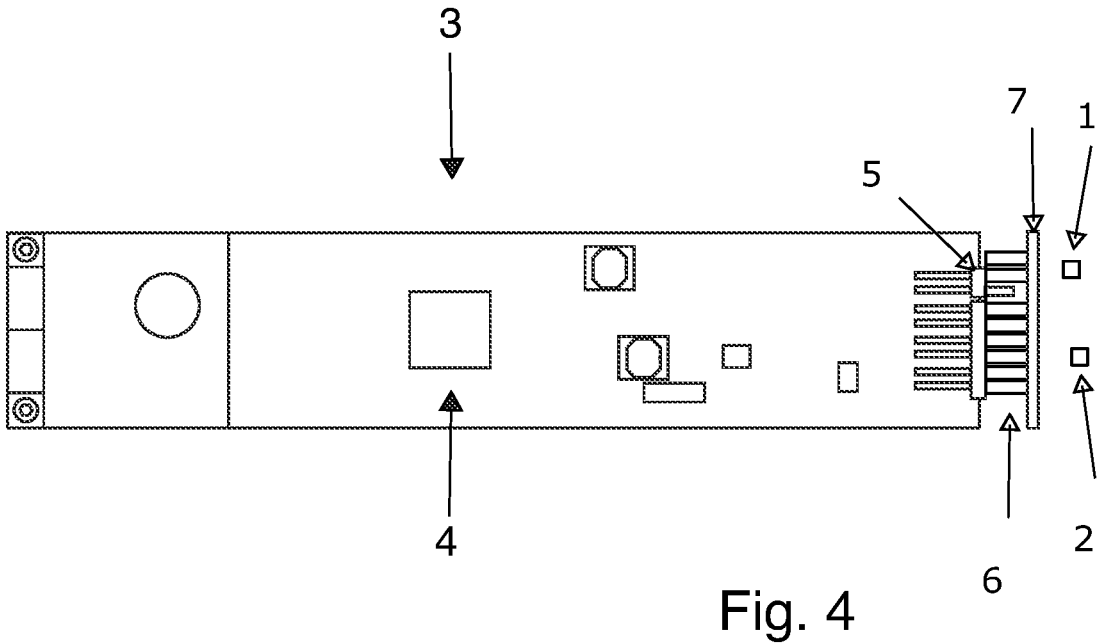
FIG. 4 shows the first and second circuit boards assembled together according to an embodiment of the present disclosure.

The two circuit boards 3, 7 are connected together via interfaces 5, 6. Via the interfaces 5, 6, signals are forwarded, or transferred, from the data processing unit 4 to the appropriate components 1, 2, 11. FIG. 3 shows, as mentioned, the two boards 3, 7 next to one another, while FIG. 4 shows the circuit boards 3, 7 connected together via the interfaces 5, 6. In such an embodiment, they are plugged into one another.

Figure 5:
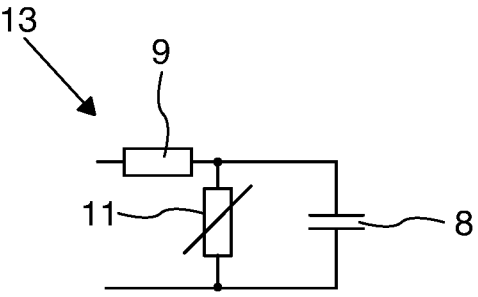
FIG. 5 shows a detailed schematic of a circuit on the second circuit board according to an embodiment of the present disclosure.

Visible on the second circuit board 7 in FIG. 2 is a resistance temperature sensor, also called a thermistor 11, which forms together with a known reference resistor 9 a voltage divider. In an embodiment, the resistor 9 is arranged on the first circuit board 3. FIG. 5 shows a circuit diagram according to the present disclosure. By providing the voltage divider with a direct current, one obtains the temperature dependent resistance value of the temperature sensor 11. Connected in parallel with the temperature sensor is a capacitor 8, whereby an RC unit results. This makes the temperature measurement only negligibly slower. The capacitance of the capacitor 8 is obtained by measuring the time constant $\tau$:

$$\tau = R \cdot C.$$

Figure 6:
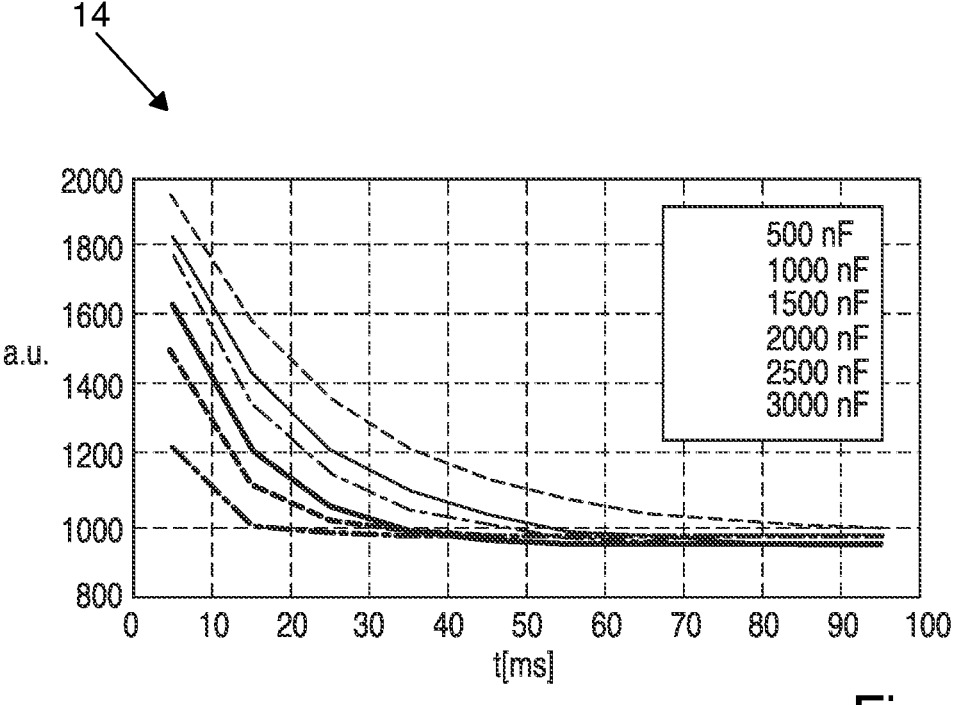
FIG. 6 shows different discharge curves representing different LEDs according to an embodiment of the present disclosure.

To do this, one temporarily switches the DC current off and charges the capacitor 8 with a charging voltage. After switching off the charging voltage, the RC unit discharges and one can record the discharge curve for determining $\tau$. FIG. 6 shows discharge curves for different capacitance values.

Since the RC unit is connected to the freely programmable input-output of the data processing unit 4, the entire procedure can be implemented by software. No additional hardware components are necessary.

Various LED-types are now coded with different capacitance values, such that one can identify the LED-type by measuring capacitance. In other words, the installed capacitor 8 is embodied and selected specifically for the particular LED 1. If a different LED 1 is used, correspondingly another capacitor 8 having a different capacitance value is selected. The data processing unit 4 reads the discharge curve, ascertains the capacitor 8 and therewith the LED 1. From this, then the suitable temperature compensation, calibration curve, aging behavior, etc. can be derived for the particular LED 1.

The invention claimed is:

1. An optical sensor, comprising:
a first circuit board comprising a data processing unit and an electrical first interface configured to interface to a second circuit board, wherein the first interface is connected to the data processing unit, wherein the first circuit board and the first interface are disposed in a first component of the optical sensor; and
the second circuit board comprising a light-emitting diode (LED), a thermistor, a capacitor, and an electrical second interface configured to connect to the first interface of the first circuit board,
wherein the LED, the thermistor and the capacitor are connected to the second interface,
wherein the capacitor is embodied specifically for the LED,
wherein the capacitor is connected in parallel with the thermistor such that the LED can be identified via a capacitance of the capacitor as determined by the data processing unit,
wherein the second circuit board and the second interface are disposed in a second component of the optical sensor, and
wherein the first component and the second component are connected by an electrical connection via the first and the second interfaces, wherein the first interface is configured to be complementary to the second interface.

2. The sensor of claim 1, wherein the second circuit board includes a photodiode.

3. The sensor of claim 1, wherein the sensor includes a resistor arranged to form a voltage divider with the thermistor.

4. The sensor of claim 3, wherein the first circuit board includes the resistor arranged to form the voltage divider with the thermistor of the second circuit board.

* * * * *